United States Patent
Azizi

(10) Patent No.: US 11,616,485 B2
(45) Date of Patent: Mar. 28, 2023

(54) OUT-OF-BAND REJECTION USING SAW-BASED INTEGRATED BALUN AND A DIFFERENTIAL LOW NOISE AMPLIFIER

(71) Applicant: Skyworks Solutions, Inc., Irvine, CA (US)

(72) Inventor: Mostafa Azizi, Kanata (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/091,485

(22) Filed: Nov. 6, 2020

(65) Prior Publication Data

US 2021/0143795 A1     May 13, 2021

Related U.S. Application Data

(60) Provisional application No. 62/933,165, filed on Nov. 8, 2019, provisional application No. 62/933,218, filed on Nov. 8, 2019.

(51) Int. Cl.
    *H03H 9/00*            (2006.01)
    *H03H 9/02*            (2006.01)
    (Continued)

(52) U.S. Cl.
CPC .............. *H03H 9/0028* (2013.01); *H03F 3/19* (2013.01); *H03H 9/0009* (2013.01);
(Continued)

(58) Field of Classification Search
CPC .............. H03H 9/0028; H03H 9/0009; H03H 9/02637; H03H 9/02834; H03H 9/02992;
(Continued)

(56) References Cited

U.S. PATENT DOCUMENTS

| | | | | |
|---|---|---|---|---|
| 5,721,519 A | * | 2/1998 | Onishi | .................. H03H 9/0038 333/194 |
| 5,892,418 A | * | 4/1999 | Onishi | .................. H03H 9/1071 333/194 |

(Continued)

OTHER PUBLICATIONS

U.S. Appl. No. 17/091,596 Published as 2021/0143789 A1, filed Nov. 6, 2020, Out-ofBand Rejection Using Saw-Based Integrated Balun.

*Primary Examiner* — Junpeng Chen
(74) *Attorney, Agent, or Firm* — Knobbe, Martens, Olson & Bear, LLP

(57) ABSTRACT

A front-end module may include an acoustic wave filter with a first and second interdigital transducer electrode. The first interdigital transducer electrode may be single-ended with a first input bus bar that receives an input signal and a second input bus bar connected to ground. The second interdigital transducer electrode may be differential with a first output bus bar connected to a first output terminal and a second output bus bar connected to a second output terminal. The front-end module may include a low noise amplifier (LNA) that outputs a differential signal via a differential output and has a differential input connected to the acoustic wave filter.

(Continued)

The LNA may include a first input transistor that receives a first signal from the first output terminal of the acoustic wave filter and a second input transistor that receives a second signal from the second output terminal of the acoustic wave filter.

20 Claims, 14 Drawing Sheets

(51) Int. Cl.
  *H03H 9/25* (2006.01)
  *H03H 9/64* (2006.01)
  *H03F 3/19* (2006.01)
  *H04B 1/12* (2006.01)
  *H03H 9/145* (2006.01)

(52) U.S. Cl.
  CPC .... *H03H 9/02637* (2013.01); *H03H 9/02834* (2013.01); *H03H 9/02992* (2013.01); *H03H 9/145* (2013.01); *H03H 9/25* (2013.01); *H03H 9/64* (2013.01); *H03H 9/6483* (2013.01); *H04B 1/12* (2013.01); *H03F 2200/294* (2013.01); *H03F 2200/451* (2013.01)

(58) Field of Classification Search
  CPC ............ H03H 9/145; H03H 9/25; H03H 9/64; H03H 9/6483; H03F 3/19; H03F 2200/294; H03F 2200/451; H04B 1/12
  See application file for complete search history.

(56) References Cited

U.S. PATENT DOCUMENTS

| | | | |
|---|---|---|---|
| 5,994,980 A * | 11/1999 | Tada | H03H 9/0028 310/313 R |
| 2003/0173598 A1* | 9/2003 | McKay | H01L 29/1087 257/E29.12 |
| 2006/0252403 A1* | 11/2006 | Garcia | H04B 1/0057 455/552.1 |
| 2007/0075804 A1* | 4/2007 | Otsuka | H03H 9/0071 333/195 |
| 2015/0078420 A1* | 3/2015 | Geurts | H03F 1/02 330/252 |
| 2018/0343000 A1 | 11/2018 | Nosaka | |
| 2019/0097606 A1 | 3/2019 | Nosaka et al. | |
| 2019/0115309 A1* | 4/2019 | Modi | H03F 3/195 |
| 2020/0036365 A1 | 1/2020 | Nosaka | |
| 2020/0119711 A1 | 4/2020 | Kadota et al. | |
| 2020/0220568 A1 | 7/2020 | Watanabe | |
| 2021/0126618 A1 | 4/2021 | Hiramatsu et al. | |
| 2021/0126624 A1 | 4/2021 | Hiramatsu et al. | |
| 2021/0143789 A1 | 5/2021 | Azizi | |
| 2021/0159878 A1 | 5/2021 | Zhang et al. | |

* cited by examiner

OUT-OF-BAND REJECTION USING SAW-BASED INTEGRATED BALUN AND A DIFFERENTIAL LOW NOISE AMPLIFIER

INCORPORATION BY REFERENCE

This application claims priority to U.S. Provisional Application No. 62/933,218, which was filed on Nov. 8, 2019 and is titled "OUT-OF-BAND REJECTION USING SAW-BASED INTEGRATED BALUN;" and U.S. Provisional Application No. 62/933,165, which was filed on Nov. 8, 2019 and is titled "FAST RAMPING POWER AMPLIFIER BOOST CONVERTER," the disclosures of which are expressly incorporated by reference herein in their entirety for all purposes. Further, this application is being filed on Nov. 6, 2020, the same date as U.S. Application Ser. No. 17/091,596, which is titled "OUT-OF-BAND REJECTION USING SAW-BASED INTEGRATED BALUN" and is hereby expressly incorporated by reference herein in its entirety for all purposes. Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave filters.

Description of the Related Art

An acoustic wave filter can include a plurality of acoustic resonators arranged to filter a radio frequency signal. Example acoustic wave filters include surface acoustic wave (SAW) filters and bulk acoustic wave (BAW) filters. A surface acoustic wave resonator of a surface acoustic wave filter typically includes an interdigital transductor electrode on a piezoelectric substrate. A surface acoustic wave resonator is arranged to generate a surface acoustic wave.

Acoustic wave filters can be implemented in radio frequency electronic systems. For instance, filters in a radio frequency front end of a mobile phone can include acoustic wave filters.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a front-end module. The front-end module may include an acoustic wave filter that includes a first interdigital transducer electrode and a second interdigital transducer electrode. The first interdigital transducer electrode may be single-ended with a first input bus bar configured to receive an input signal and a second input bus bar connected to ground. The second interdigital transducer electrode may be differential with a first output bus bar connected to a first output terminal and a second output bus bar connected to a second output terminal. The front-end module may further include a low noise amplifier with a differential input electrically connected to the acoustic wave filter. The low noise amplifier may include a first input transistor configured to receive a first signal from the first output terminal of the acoustic wave filter and a second input transistor configured to receive a second signal from the second output terminal of the acoustic wave filter. The low noise amplifier may be configured to output a differential signal via a differential output.

In certain aspects, the differential output includes a first output node and a second output node. The first output node may be connected to a drain of the first input transistor and the second output node may be connected to a drain of the second input transistor. Further, the first output terminal may be a positive terminal and the second output terminal may be a negative terminal. The acoustic wave filter may be one of a surface acoustic wave filter, a bulk acoustic wave filter, a temperature compensated surface acoustic wave filter, or a film bulk acoustic wave filter. In certain embodiments, the front-end module may include a first matching circuit connected between the first output terminal of the acoustic wave filter and the first input transistor of the low noise amplifier. Moreover, the front-end module may include a second matching circuit connected between the second output terminal of the acoustic wave filter and the second input transistor of the low noise amplifier. In some cases, the first matching circuit is configured to perform impedance matching between the acoustic wave filter and the low noise amplifier.

In some implementations, the front-end module further includes a balun electrically connected to the differential output of the low noise amplifier. The balun may be a transformer balun that is configured to convert a differential output to a single-ended output. In certain embodiments, the front-end module may include a second acoustic wave filter. In some cases, the differential output of the low noise amplifier includes a first output node and a second output node, and the second acoustic wave filter includes a first interdigital transducer electrode and a second interdigital transducer electrode. The first interdigital transducer electrode of the second acoustic wave filter may be differential, and may have a first input bus bar configured to receive a first input signal from the first output node and a second input bus bar configured to receive a second input signal from a second output node. The second interdigital transducer electrode may be single-ended with a first output bus bar connected to an output terminal and a second output bus bar connected to ground. The second acoustic wave filter may be of a different type or may be configured differently than the acoustic wave filter. Further, a connection between the acoustic wave filter and the low noise amplifier may be configured to provide balun functionality between the acoustic wave filter and the low noise amplifier without the inclusion of a balun circuit element.

Yet other aspects of the present disclosure are directed to a multi-chip module. The multi-chip module may include a stacked filter low noise amplifier circuit including an acoustic wave filter and a low noise amplifier with a differential input electrically connected to the acoustic wave filter. The acoustic wave filter may include a first interdigital transducer electrode and a second interdigital transducer electrode. The first interdigital transducer electrode may be single-ended with a first input bus bar configured to receive an input signal and a second input bus bar connected to ground. The second interdigital transducer electrode may be differential with a first output bus bar connected to a first output terminal and a second output bus bar connected to a second output terminal. The low noise amplifier may include a first input transistor configured to receive a first signal from the first output terminal of the acoustic wave filter and a second input transistor configured to receive a second signal from the second output terminal of the acoustic wave filter. The low noise amplifier may be configured to output a differential signal via a differential output. The multi-chip module may further include a signal converter configured to convert the differential signal from the differential output to a single signal.

In some implementations, the signal converter includes a balun electrically connected to the differential output of the low noise amplifier. Further, the signal converter may include a second acoustic wave filter that includes a first interdigital transducer electrode and a second interdigital transducer electrode. The first interdigital transducer electrode of the second acoustic wave filter may be differential, and may have a first input bus bar configured to receive a first input signal from a first output node of the low noise amplifier and a second input bus bar configured to receive a second input signal from a second output node of the low noise amplifier. The second interdigital transducer electrode may be single-ended with a first output bus bar connected to an output terminal and a second output bus bar connected to ground. Moreover, the multi-chip module may include a first matching circuit connected between the first output terminal of the acoustic wave filter and the first input transistor of the low noise amplifier, and a second matching circuit connected between the second output terminal of the acoustic wave filter and the second input transistor of the low noise amplifier.

Certain additional aspects of the present disclosure are directed to a wireless device. The wireless device may include an antenna configured to receive a plurality of signals. Each signal of the plurality of signals may be associated with a different frequency band. Further, the wireless device may include a front-end module that includes an acoustic wave filter and a low noise amplifier with a differential input electrically connected to the acoustic wave filter. The acoustic wave filter may include a first interdigital transducer electrode and a second interdigital transducer electrode. The first interdigital transducer electrode may be single-ended with a first input bus bar configured to receive an input signal and a second input bus bar connected to ground. The second interdigital transducer electrode may be differential with a first output bus bar connected to a first output terminal and a second output bus bar connected to a second output terminal. The low noise amplifier may include a first input transistor configured to receive a first signal from the first output terminal of the acoustic wave filter and a second input transistor configured to receive a second signal from the second output terminal of the acoustic wave filter. The low noise amplifier may be configured to output a differential signal via a differential output. In certain embodiments, the acoustic wave filter and the low noise amplifier are implemented in a stacked filter low noise amplifier circuit.

Certain aspects of the present disclosure relate to a front-end module. The front-end module may include an acoustic wave filter that includes a first interdigital transducer electrode and a second interdigital transducer electrode. The first interdigital transducer electrode may be single-ended with a first input bus bar configured to receive an input signal and a second input bus bar connected to ground. The second interdigital transducer electrode may be differential with a first output bus bar connected to a first output terminal and a second output bus bar connected to a second output terminal. The front-end module may further include a low noise amplifier with a differential input electrically connected to the acoustic wave filter. The low noise amplifier may include a first input transistor configured to receive a first signal from the first output terminal of the acoustic wave filter and a second input transistor configured to receive a second signal from the second output terminal of the acoustic wave filter. The low noise amplifier may be configured to convert the differential input to a single-ended output with respect to ground.

In some aspects, the first output terminal is a positive terminal and the second output terminal is a negative terminal. Further, the acoustic wave filter may be one of a surface acoustic wave filter, a bulk acoustic wave filter, a temperature compensated surface acoustic wave filter, or a film bulk acoustic wave filter. In some implementations, the front-end module may further include a matching circuit connected between the acoustic wave filter and the low noise amplifier. The matching circuit may be configured to perform impedance matching between the acoustic wave filter and the low noise amplifier. Moreover, the matching circuit may include a first matching element connected between the first output terminal of the acoustic wave filter and the first input transistor, and a second matching element connected between the second output terminal of the acoustic wave filter and the second input transistor. The first matching element and the second matching element may be configured the same. In some implementations, the matching circuit includes one or more inductors.

In certain embodiments, the first output terminal of the acoustic wave filter outputs a first signal and the second output terminal of the acoustic wave filter outputs a second signal. The first signal and the second signal may have a 180-degree phase difference. Further, a connection between the acoustic wave filter and the low noise amplifier is configured to provide balun functionality between the acoustic wave filter and the low noise amplifier without the inclusion of a balun circuit element. In some cases, the first output bus bar is impedance matched to the first input transistor and the second output bus bar is impedance matched to the second input transistor without the inclusion of an impedance matching circuit connected between the acoustic wave filter and the low noise amplifier. Further, the single-ended output may be connected to a drain of the second input transistor.

Yet other aspects of the present disclosure relate to a multi-chip module (MCM). The multi-chip module may include an input port configured to receive a radio frequency signal and a stacked filter low noise amplifier circuit. The stacked filter may include an acoustic wave filter and a low noise amplifier with a differential input electrically connected to the acoustic wave filter. The acoustic wave filter may include a first interdigital transducer electrode and a second interdigital transducer electrode. The first interdigital transducer electrode may be single-ended with a first input bus bar configured to receive the radio frequency signal from the input port and a second input bus bar connected to ground. The second interdigital transducer electrode may be differential with a first output bus bar connected to a first output terminal and a second output bus bar connected to a second output terminal. The low noise amplifier may include a first input transistor configured to receive a first signal from the first output terminal of the acoustic wave filter and a second input transistor configured to receive a second signal from the second output terminal of the acoustic wave filter. Further, the multi-chip module may include at least one output port configured to receive an output signal from the low noise amplifier.

In some aspects, the acoustic wave filter is one of a surface acoustic wave filter, a bulk acoustic wave filter, a temperature compensated surface acoustic wave filter, or a film bulk acoustic wave filter. Further, the multi-chip module may include a matching circuit connected between the acoustic wave filter and the low noise amplifier. The matching circuit may be configured to perform impedance matching between the acoustic wave filter and the low noise amplifier. Moreover, the matching circuit may be included as part of the stacked filter low noise amplifier circuit. The matching circuit may be separate from and in communication with the stacked filter low noise amplifier circuit. In addition, the matching circuit may include a first matching element connected between the first output terminal of the acoustic wave filter and the first input transistor, and a second matching element connected between the second output terminal of the acoustic wave filter and the second input transistor. In some implementations, a connection between the acoustic wave filter and the low noise amplifier is configured to provide balun functionality between the acoustic wave filter and the low noise amplifier without the inclusion of a balun circuit element.

Certain additional aspects of the present disclosure are directed to a wireless device. The wireless device may include an antenna configured to receive a plurality of signals. Each signal of the plurality of signals may be associated with a different frequency band. The wireless device may further include a front-end module that includes an acoustic wave filter and a low noise amplifier with a differential input electrically connected to the acoustic wave filter. The acoustic wave filter may include a first interdigital transducer electrode and a second interdigital transducer electrode. The first interdigital transducer electrode may be single-ended with a first input bus bar configured to receive an input signal and a second input bus bar connected to ground, and the second interdigital transducer electrode being differential with a first output bus bar connected to a first output terminal and a second output bus bar connected to a second output terminal. The low noise amplifier may include a first input transistor configured to receive a first signal from the first output terminal of the acoustic wave filter and a second input transistor configured to receive a second signal from the second output terminal of the acoustic wave filter. The low noise amplifier may be configured to convert the differential input to a single-ended output with respect to ground.

In some cases, the front-end module further includes a matching circuit connected between the acoustic wave filter and the low noise amplifier. The matching circuit may be configured to perform impedance matching between the acoustic wave filter and the low noise amplifier.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Figure 1A:
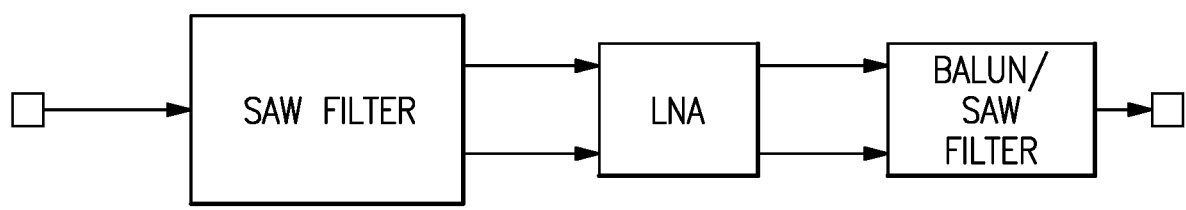
FIG. 1A is a block diagram of an example of a balunless differential low noise amplifier circuit design that can be included in a front-end module.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In this description, references to "an embodiment," "one embodiment," or the like, mean that the particular feature, function, structure or characteristic being described is included in at least one embodiment of the technique introduced herein. Occurrences of such phrases in this specification do not necessarily all refer to the same embodiment. On the other hand, the embodiments referred to are also not necessarily mutually exclusive.

Introduction

Wireless devices typically receive multiple wireless signals of different frequency bands. In some cases, a wireless device may be capable of processing signals of a single frequency band or set of frequency bands. In other cases, the wireless device may be capable of processing signals of different frequency bands or sets of frequency bands. In some cases, the different frequency bands are associated with different technologies, communication standards, or features of the wireless device. For example, a wireless device may be capable of communication using Wi-Fi technology and cellular technology (e.g., 4G, 4G LTE, 5G, and the like). Further, a wireless device may include geo-location services, such as those provided by or enabled by the Global Positioning System (GPS).

A front-end module may process signals received by a wireless device before providing the processed signals to a receiver or transceiver within the wireless device. Processing the received signals may include filtering out undesired signals. These undesired signals may be associated with frequency bands not supported by the particular receiver. In some cases, some of the undesired signals may be associated with frequency bands supported by other receivers within the wireless device. Thus, the undesired signals may be noise for a particular receiver, but may be the target or desired signals for another receiver within the wireless device.

Regardless of whether the undesired signals are general noise or interference, or are communication signals to be received by another front-end module or receiver within the wireless device, the undesired signals may be problematic for a particular receiver because the undesired signals may mask the desired signal or desensitize the front-end module or receiver due to intermodulation and/or harmonic interference. For example, a GPS front-end module may be configured to process L1 GPS signals (e.g., GPS signals of approximately 1.575 GHz). However, the GPS front-end module may also receive 2.4 GHz Wi-Fi signals and 800 MHz Long-Term Evolution (LTE) signals (or band 13 LTE signals). The intermodulation of the 2.4 GHz Wi-Fi signals with the 800 MHz LTE signals is approximately 1.6 GHz. The intermodulation frequency in this example is close enough to the frequency of the GPS signal to mask the GPS signal or to cause noise within the GPS signal. Further, the second harmonic of the 800 MHz LTE signal is also approximately 1.6 GHz, which may further cause interference with identifying the GPS signal. For example, the LTE Band 13 is 777-787 MHz and has a second harmonic of 1554-1574 MHz, and the LTE Band 14 is 788-798 MHz and has a second harmonic of 1576-1596 MHz. In other words, both Band 13 and 14 have second harmonics that are approximately equal to or very close to the GPS frequency. Thus, in some cases, harmonic interference may mask a received GPS signal or otherwise introduce noise that causes interference in the signal.

Further, in some cases, interference may also be caused by intermodulation as described above. In some cases, the majority of the interference may be caused by second order intermodulation (IM2) products. For example, an LTE Band 8 signal of 915 MHz and a 2.4 GHz WiFi signal of 2472 MHz may result in a second order intermodulation product of 1557 MHz, which is close to the GPS frequency band of 1.575 GHz. As another example, an LTE Band 26 signal of 840 MHz and a 2.4 GHz WiFi signal of 2415 MHz may result in a second order intermodulation product of 1575 MHz, which is equal to the GPS frequency band of 1.575 GHz. Thus, IM2 products may interfere or otherwise introduce noise that reduces the capability of a receiver to distinguish GPS signal.

The use of a differential receiver may be used to reduce or eliminate the IM2 products. With a differential receiver, the positive side (e.g., the positive signal) and the negative side (e.g., the negative signal) of the receiver may be of the same voltage, but opposite sign or phase. Consequently, the second order harmonic may be cancelled reducing or eliminating the IM2 product. By reducing or eliminating the IM2 product, interference may be reduced or eliminated and the receiver (e.g., the GPS receiver) may distinguish desired signals (e.g., 1.6 GHz signals in the case of the GPS receiver) from other received signals (e.g., 2.4 GHz Wi-Fi signals or 800 MHz LTE signals).

A differential receiver or a font-end module in communication with the receiver, may have a differential low noise amplifier (LNA). With the differential LNA, two matching networks may be needed. Further, a balance or balun may be used in front of the LNA to convert between the unbalanced signal and the balanced signal, or between a single-ended signal and a differential signal. The additional circuitry used with the differential receiver may add loss and noise to the receiver or signal. Thus, although the IM2-based interference may be reduced, additional loss and noise are introduced.

Aspects of the present disclosure reduce or eliminate the additional loss and noise that occurs with a differential receiver by eliminating the balun from the circuit. The balun may be eliminated by using an acoustic wave filter, such as a surface acoustic wave (SAW) filter, and configuring the SAW filter to provide balun functionality without the inclusion of a separate balun circuit element. Further, as a receiver typically includes a filter, such as a diplexer, the SAW filter may be included without adding additional circuit elements to the receiver, or front-end module, which may be included in the receiver or may pre-process the signal before it is provided to the receiver. FIG. 1A is a block diagram of an example of a balunless differential low noise amplifier circuit design that can be included in a front-end module. As illustrated, the SAW filter may convert a signal at a single-ended input to a differential output, which may then be fed to subsequent circuitry without the inclusion of a balun.

The configuring of the SAW filter as a balun may reduce the loss and/or noise that may occur with a differential receiver or front-end module. Further, in some cases, the SAW filter and subsequent LNA may be configured to match impedances eliminating the matching circuit between the filter and LNA. The elimination of the matching circuit may further reduce loss or noise in the differential receiver, or front-end module.

Acoustic wave filters may be formed from acoustic wave resonators. An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band. As an additional example, one or more acoustic wave resonators in accordance with any suitable principles and advantages disclosed herein can be included in a filter arranged to filter a radio frequency signal in a global positioning system (GPS) receiver.

Although much of the present disclosure relates to reducing interference that may affect the ability of a GPS receiver to receive or distinguish GPS signals from other signals, it should be understood that the present disclosure may be applied to other receivers and is not limited to GPS receivers. For example, aspects of the present disclosure may be applied to Wi-Fi receivers, 4G receivers, 5G receivers, and the like.

Example Wireless Device

Figure 1B:
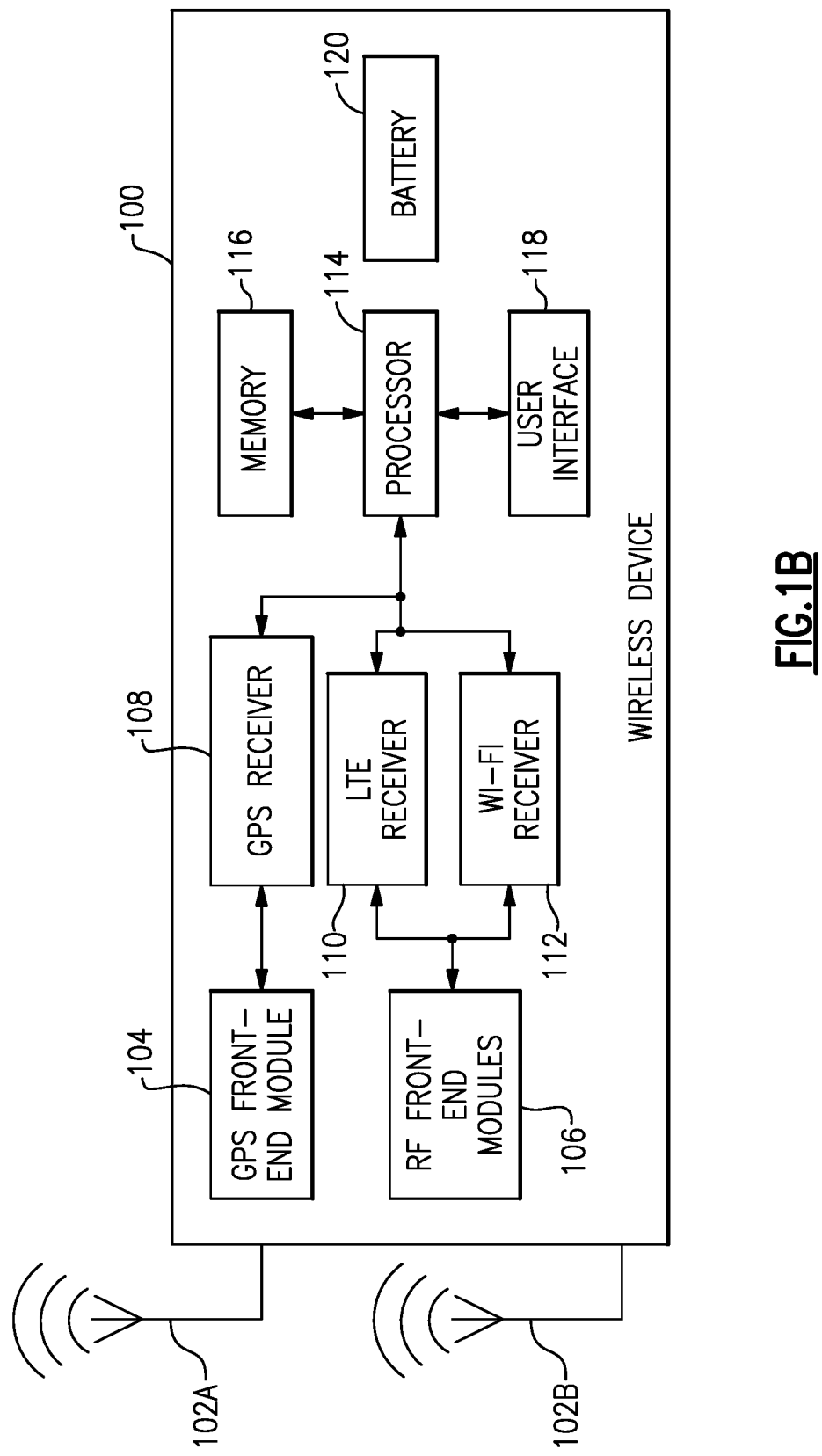
FIG. 1B illustrates a block diagram of an embodiment of a wireless device.

FIG. 1B illustrates a block diagram of an embodiment of a wireless device 100. The wireless device 100 may include any type of wireless device that is configured to receive wireless signals. In some cases, the wireless device 100 may include any type of wireless devices capable of processing a plurality of wireless signals using a plurality of technologies, communication standards, or features of the wireless device 100. For example, the wireless device 100 may be a cellular phone (including a smart phone or a dumb phone), a tablet device, a laptop, a smartwatch, a pair of smart glasses, or any other wearable device, internet-of-things (IOT) device, or computing device that may include wireless capability.

The example illustrated in FIG. 1B is of a wireless device that includes the capability of receiving a GPS signal, a Wi-Fi signal, and a 4G LTE signal. However, the wireless device 100 is not limited as such and may include wireless devices that are capable of receiving and/or processing fewer or greater numbers of wireless signals, or other types of wireless signals. For example, the wireless device 100 may be capable of receiving Bluetooth® signals, 5G signals, near-field communication (NFC) signals, and the like.

The wireless device 100 may include one or more antennas 102A, 102B (which may be referred to in the singular as antenna 102 or collectively as antennas 102). The antennas 102 may be configured to receive one or more signals of one or more different frequencies or frequency bands. For example, the antennas 102 may receive signals having frequencies associated with GPS (e.g., 1.575 GHz), Wi-Fi (e.g., 2.4 GHz), or cellular communication (e.g., 800 MHz). It should be understood that any particular antenna 102 may be configured to receive signals of a plurality of different frequency bands. For example, the antenna 102A may be configured to receive any of the signals in the aforementioned example (e.g., signals from between 800 MHz to 2.4 GHz).

Signals received at the antennas 102 may be provided to one or more front-end modules within the wireless device 100. The wireless device 100 may include a GPS front-end module 104 and one or more additional RF front-end modules 106. It should be understood that the GPS front-end module 104 may also be an RF front-end module in that GPS signals are within the radio frequency band.

The GPS front-end module 104 may include any front-end module that is capable of processing signals within one or more GPS frequency bands. Further, the GPS front-end module 104 may include any type of front-end module that is capable of performing pre-filtering before providing a received signal to a receiver, such as the GPS receiver 108. As will be described in more detail below, the GPS front-end module 104 may include additional out-of-band filtering capability that reduces or prevents the occurrence of harmonic interference and/or intermodulation interference.

The RF front-end modules 106 may include one or more front-end modules that are capable of processing signals within one or more RF frequency bands. For example, the RF front-end modules 106 may include front-end modules capable of processing Wi-Fi signals or LTE cellular communication signals. In some embodiments, the RF front-end modules 106 may include similar capabilities as the GPS front-end module 104 enabling the reduction or prevention of the occurrence of harmonic interference and/or intermodulation interference within target frequency bands for the particular RF front-end modules 106. For example, for an RF front-end module 106 configured to process signals for LTE cellular communications, the RF front-end module 106 may be configured to reduce or prevent harmonic interference and/or intermodulation interference within one or more of the LTE cellular communication frequency bands.

The GPS front-end module may isolate, identify, or pass signals associated with a GPS frequency while reducing or blocking out-of-band signals not associated with GPS. The filtered GPS signals may be amplified using, for example, a low noise amplifier (LNA) in the GPS front-end module and then the amplified GPS signals may be provided to the GPS receiver 108. The GPS receiver 108 may include any type of receiver that can process the amplified GPS signals. The GPS receiver 108 may further filtered the amplified GPS signals. In addition, the GPS receiver 108 may include frequency down-conversion, such as via a demodulator, and may demodulate the signal received from the GPS front-end module 104. Further, the GPS receiver 108 may include analog-to-digital conversion that can convert the analog signal received from the GPS front-end module 104 to a digital signal, which may then be processed by the processor 114.

In some embodiments, the wireless device 100 may further include additional filters and/or amplifiers between the GPS front-end module 104 and the GPS receiver 108. Further, in some embodiments, the GPS receiver 108 may be part of a transceiver.

The wireless device 100 may further include one or more additional receivers configured to receive filtered and/or amplified signals from the one or more additional RF front-end modules 106. For example, the wireless device 100 includes an LTE receiver 110 capable of processing LTE signals and a Wi-Fi receiver 112 capable of processing Wi-Fi signals.

The receivers 108, 110, and 112 may each be in communication with the processor 114. The processor 114 may provide any suitable baseband processing functions for the wireless device 100. Further, the processor 114 may provide any general processing capability for the wireless device 100.

The front-end modules 104, 106 and/or the receivers 108, 110, 112 may include differential-based circuitry. For example, the front-end modules 104, 106 and/or the receivers 108, 110, 112 may include differential LNAs. One or more acoustic wave filters (e.g., SAW or BAW filters) may convert a received signal to a differential signal to provide to the LNAs.

The memory 116 can store any suitable data for the wireless device 100. Further, the memory 116 may include any type of memory including both volatile and non-volatile memory.

The user interface 118 may include any type of user interface capable of receiving user inputs and/or outputting data to a user. For example, the user interface 118 may include a display, a touchscreen, one or more interactive user interface devices (e.g., buttons, sliders, capacitive sensors, resistive sensors, and the like), or any other user interface elements.

The wireless device 100 may further include a battery 120 or other power source capable of powering the wireless device 100 and/or one or more elements of the wireless device 100. The battery 120 may include rechargeable batteries. Further, the battery 120 may include or be replaced by any other type of power supply system.

Example Front-End Module

Figure 2:
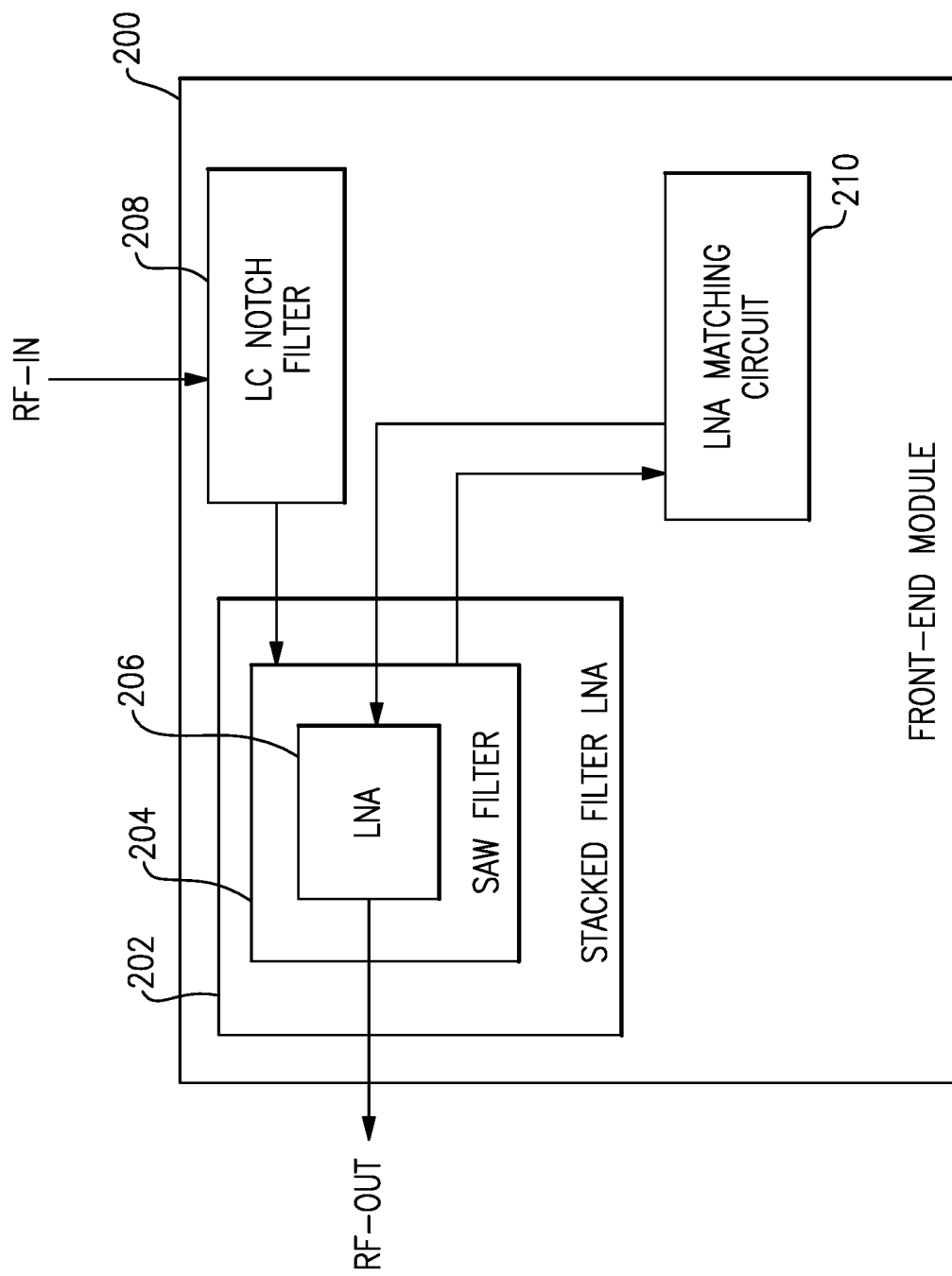
FIG. 2 illustrates a block diagram of an embodiment of a front-end module.

FIG. 2 illustrates a block diagram of an embodiment of a front-end module 200. The front-end module 200 may be an example of the GPS front-end module 104. Alternatively, or in addition, the front-end module 200 may be an example of any other front-end module that may be included within the wireless device 100, such as one of the RF front-end modules 106.

The front-end module 200 may be any type of front-end module. In some embodiments, the front-end module 200 may be a size constrained front-end module. For example, the front-end module 200 may be fit within a 1.6×1.6 mm package. Accordingly, in certain embodiments, each element of the front-end module 200 must be positioned to fit within the 1.6×1.6 mm package. It should be understood that the front-end module 200 may be designed to fit within a larger or smaller package. However, in certain embodiments, device specifications may require that the front and module 200 not be implemented in a larger package than the 1.6×1.6 mm package.

The front-end module 200 may include a stacked filter LNA 202. The stacked filter LNA may include a low noise amplifier 206 (LNA 206) stacked on top of a filter, such as the surface acoustic wave (SAW) filter 204. It should be understood that the filter may include other types of filters and is not limited to a SAW filter. For example, the filter 204 may be or may include a bulk acoustic wave (BAW) filter, a thin-film bulk acoustic wave resonator (FBAR) type filter, a temperature compensated SAW (TCSAW) device, or an integrated passive device (IPD) filter.

Further, the front-end module 200 may include a filter at the input of the front-end module 200. This filter may be a notch filter such as an inductor and capacitor (LC) notch filter 208. In certain embodiments, the LC notch filter 208 is a type of band stop filter configured to filter out signals associated with a particular communication band. For example, the LC notch filter 208 may be a notch filter to further reduce signal close to the 800 MHz band (e.g., LTE band 13).

The front-end module 200 may receive an RF input, which is provided to the LC notch filter 208. After the LC notch filter 208 filters the RF input, the filtered input may be provided to the stacked filter LNA 202. The stacked filter LNA 202 may filter the RF signal received from the LC notch filter 208 using the SAW filter 204 and may amplify the filtered signal using the LNA 206 before outputting the filtered and amplified RF signal.

The front-end module 200 further includes an LNA matching circuit 210. The LNA matching circuit 210 may include any circuit that can match the impedance between the SAW filter 204 and the LNA 206. The LNA matching circuit 210 may include an inductor. The inductor of the LNA matching circuit 210 and the inductor of the LC notch filter 208 may each generate magnetic fields that can result in coupling between the LC notch filter 208 and the LNA matching circuit 210. This coupling is typically undesirable because the coupling can effectively result in the bypassing of one or more of the filters. Thus, the filters within the front-end module may be ineffective. For at least this reason, one or more elements (e.g., the inductor) of the LC notch filter 208 and one or more elements (e.g., the inductor) of the LNA matching circuit 210 may be selected and/or positioned to reduce or eliminate coupling.

In certain embodiments, the SAW filter 204 may itself filter undesired signals at a target frequency. However, the amount of filtering may be insufficient. For example, the SAW filter 204 may have 40 dB rejection at 2.4 GHz, but it may be desirable to have 50 dB rejection to, for example, improve the sensitivity of the wireless device to GPS signals. By using a differential circuit (e.g., differential LNA) to filter the second order intermodulation product, additional filtering or rejection at 2.4 GHz may be obtained and may improve rejection at the target frequency by up to 20 dB giving a total rejection of 60 dB and exceeding the desired 50 dB rejection at the target frequency.

Advantageously, in certain embodiments, by improving the rejection at the desired frequency without adding additional circuits and by eliminating the balun, additional filtering can be included in the front-end module 200 without increasing the size of the front-end module 200. Further, in some cases, the LNA matching circuit 210 may be eliminated further reducing the size of the front-end module 200. Accordingly, a size-limited front-end module can implement embodiments of the present disclosure to improve the amount of rejection of one or more target frequencies. By improving the rejection of the one or more target frequencies, harmonic and/or intermodulation interference may be reduced. Consequently, the masking of a desired signal may also be reduced.

In certain embodiments, the front-end module 200 may include one or more additional circuit elements. For example, the front-end module 200 may include a decoupling capacitor that is configured to decouple a supply voltage, Vcc, of the front-end module.

In some embodiments, the front-end module 200 may be a multi-chip module (MCM). For example, the stacked filter LNA 202 may be located on one chip while the LC notch filter 208 and/or the LNA matching circuit 210 may be located on another chip. The multiple chips may be combined together on a single printed circuit board or on a single chip.

Example Surface Acoustic Wave Device

Figure 3A:
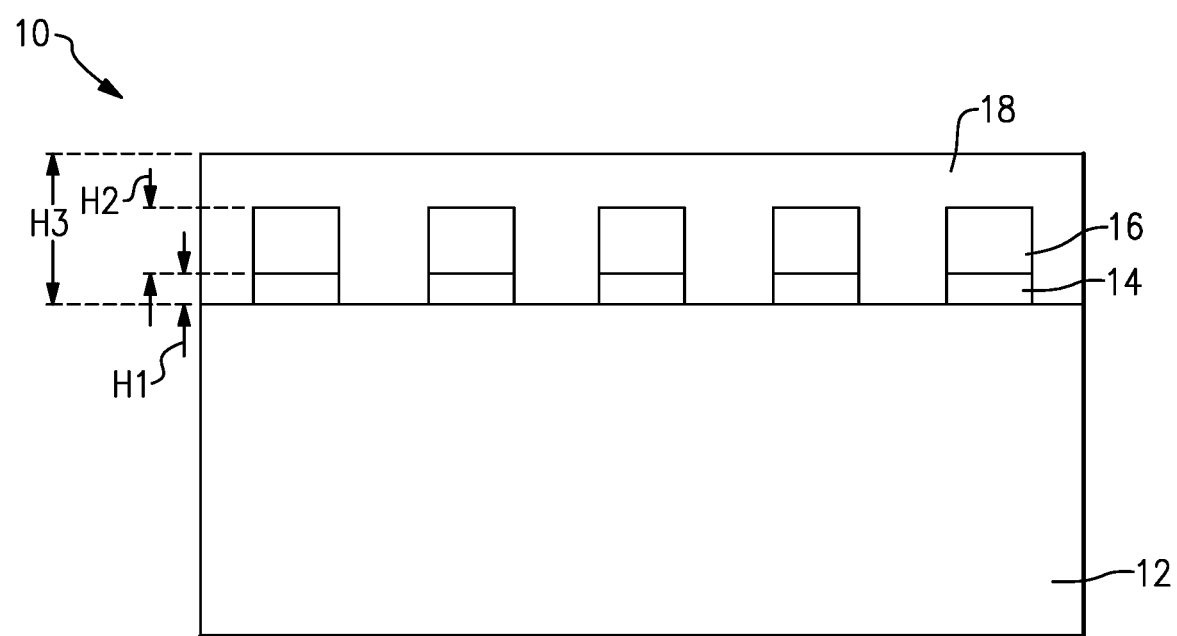
FIG. 3A is a cross sectional view of a surface acoustic wave device according to certain aspects.

FIG. 3A is a cross sectional view of a surface acoustic wave device 10 according to certain aspects. The surface acoustic wave device 10 may be used as a filter and may be referred to as a SAW filter. Further, the surface acoustic wave device 10 is an example of a device that may be used as the SAW filter 204. However, the present disclosure is not limited as such and the SAW filter 204 may include other types of SAW filters, or other types of acoustic wave devices as previously described.

The surface acoustic wave device 10 includes a multi-layer IDT electrode in which the upper IDT electrode has a thickness that reduces insertion loss relative to a thinner upper IDT electrode layer. As illustrated, the surface acoustic wave device 10 includes a piezoelectric layer 12, a multi-layer IDT electrode that includes a first IDT electrode layer 14 and a second IDT electrode layer 16, and a temperature compensation layer 18 over the multi-layer IDT electrode. The surface acoustic wave device 10 can be referred to as a temperature compensated surface acoustic wave device. In the surface acoustic wave device 10, the multi-layer IDT electrode includes separate IDT electrode layers that impact acoustic properties and electrical properties, respectively. Accordingly, electrical properties, such as insertion loss, can be improved by adjusting one of the IDT electrode layers without significantly impacting acoustic properties.

The piezoelectric layer 12 can be a lithium based piezoelectric layer. For example, the piezoelectric layer 12 can be a lithium niobate layer. As another example, the piezoelectric layer 12 can be a lithium tantalate layer. In the surface acoustic wave device 10, the multi-layer IDT electrode is over the piezoelectric layer 12.

The first IDT electrode layer 14 can be referred to as a lower electrode layer. The first IDT electrode layer 14 is disposed between the second IDT electrode layer 16 and the piezoelectric layer 12. As illustrated, the first IDT electrode layer 14 has a first side in physical contact with the piezoelectric layer 12 and a second side in physical contact with the second IDT electrode layer 16.

The first IDT electrode layer 14 can impact acoustic properties of the surface acoustic wave device 10. For instance, the thickness $H_1$ of the first IDT electrode layer 14 can impact resonant frequency of the surface acoustic wave device 10. The first IDT electrode layer can include molybdenum (Mo), tungsten (W), gold (Au), silver (Ag), copper (Cu), platinum (Pt), ruthenium (Ru), titanium (Ti), the like, or any suitable combination thereof. For instance, the first IDT electrode layer 14 can be a molybdenum layer in certain applications. The first IDT electrode layer 14 can have a thickness $H_1$ in a range from about 80 nm to 100 nm in certain applications. The first IDT electrode layer 14 can be thinner than the second IDT electrode layer 16.

The second IDT electrode layer 16 can be referred to as an upper electrode layer. The second IDT electrode layer 16 is disposed between the first IDT electrode layer 14 and the temperature compensation layer 18. As illustrated, the second IDT electrode layer 16 has a first side in physical contact with the first IDT electrode layer 14 and a second side in physical contact with the temperature compensation layer 18.

The second IDT electrode layer 16 can impact electrical properties of the surface acoustic wave device 10. The thickness of the second IDT electrode layer 16 can impact insertion loss of the surface acoustic wave resonator 10. The thickness of the second IDT electrode layer 16 may not significantly impact acoustic properties of the surface acoustic wave device 10. The second IDT electrode layer 16 can include aluminum (Al) or any suitable alloy thereof. The thickness $H_2$ of the second IDT electrode layer 16 can be based on aluminum conductivity determined by input power.

The thickness $H_2$ of the second IDT electrode layer 16 can be sufficiently thick to improve insertion loss relative to a thinner IDT electrode layer. For example, the thickness $H_2$ of the second IDT electrode layer 16 can be at least 200 nm. In some instances, the thickness $H_2$ of the second IDT electrode layer 16 can be sufficiently thick to saturate insertion loss improvement associated with the thickness of the second IDT electrode layer 16. The thickness $H_2$ can be sufficiently thick to improve insertion loss but not so thick as to significantly reduce electromechanical coupling coefficient ($k^2$). An upper limit of the thickness of the second IDT electrode layer 16 in the surface acoustic wave device 10 can be bounded by the thickness $H_3$ of the temperature compensation layer 18 minus the thickness $H_1$ of the first IDT electrode layer 14. In some instances, there can also be a margin for the temperature compensation layer 18 to cover the second IDT electrode layer 16. As one example, the thickness of the second IDT electrode layer 16 can be less than 500 nm in certain instances.

Although embodiments disclosed herein include IDT electrodes with two IDT electrode layers, any suitable principles and advantages disclosed herein can be applied to multi-layer IDT electrodes that include three or more IDT electrode layers.

In the surface acoustic wave device 10, the temperature compensation layer 18 can bring a temperature coefficient of frequency (TCF) of the surface acoustic wave device 10 closer to zero. The temperature compensation layer 18 can have a positive TCF. This can compensative for a negative TCF of the piezoelectric layer 12. The piezoelectric layer 12 can be lithium niobate or lithium tantalate, which both have a negative TCF. The temperature compensation layer 18 can be a dielectric film. The temperature compensation layer 18 can be a silicon dioxide layer. In some other embodiments, a different temperature compensation layer can be implemented. Some examples of other temperature compensation layers include a tellurium dioxide ($TeO_2$) layer or a silicon oxyfluoride (SiOF) layer. The temperature compensation layer 18 can have a thickness $H_3$ in a range from 300 nm to 2.1 micrometers (μm). In certain applications, the thickness $H_3$ of the temperature compensation layer 18 can be in a range from about 500 nm to 600 nm.

The surface acoustic wave device 10 and/or other acoustic wave devices disclosed herein can be included in a band pass filter. The band pass filter can have a passband with a center frequency in a particular range, such as a range from 1.5 gigahertz (GHz) to 2.5 GHz. The center frequency can be an arithmetic mean or a geometric mean of a lower cutoff frequency of the passband and an upper cutoff frequency of the passband. The center frequency in a range from 1.5 GHz to 2.2 GHz in certain instances. The passband can have a bandwidth in a range from 5 megahertz (MHz) to 100 MHz in certain applications. The band pass filter can have a passband defined by a communication standard in which the passband is within a frequency range from 1.5 GHz to 2.5 GHz.

In some instances, the surface acoustic wave device 10 and/or other acoustic wave devices disclosed herein can be included in a band stop filter having a center frequency in a range from 1.5 GHz to 2.5 GHz. The stop band of the band stop filter can have a bandwidth in a range from 5 MHz to 100 MHz in certain applications.

Figure 3B:
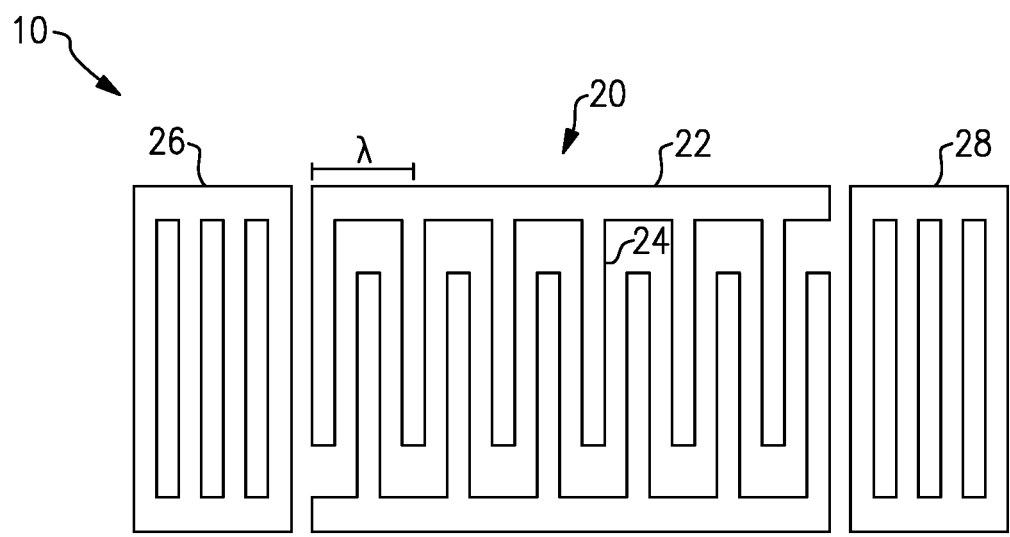
FIG. 3B illustrates an interdigital transducer electrode of the surface acoustic wave device of FIG. 3A in plan view.

FIG. 3B illustrates an interdigital transducer electrode 20 of the surface acoustic wave device 10 of FIG. 3A in plan view. The temperature compensation layer 18 is not shown in FIG. 3B to focus on the IDT electrode 20. The IDT electrode 20 is positioned between a first acoustic reflector 26 and a second acoustic reflector 28. The acoustic reflectors 26 and 28 are separated from the IDT electrode 20 by respective gaps. The IDT electrode 20 includes the bus bar 22 and IDT fingers 24 extending from the bus bar 22. The IDT fingers 24 have a pitch of A. The surface acoustic wave device 10 can include any suitable number of IDT fingers 24. The pitch A of the IDT fingers 24 corresponds to a resonant frequency of the surface acoustic wave device 10.

Figure 4:
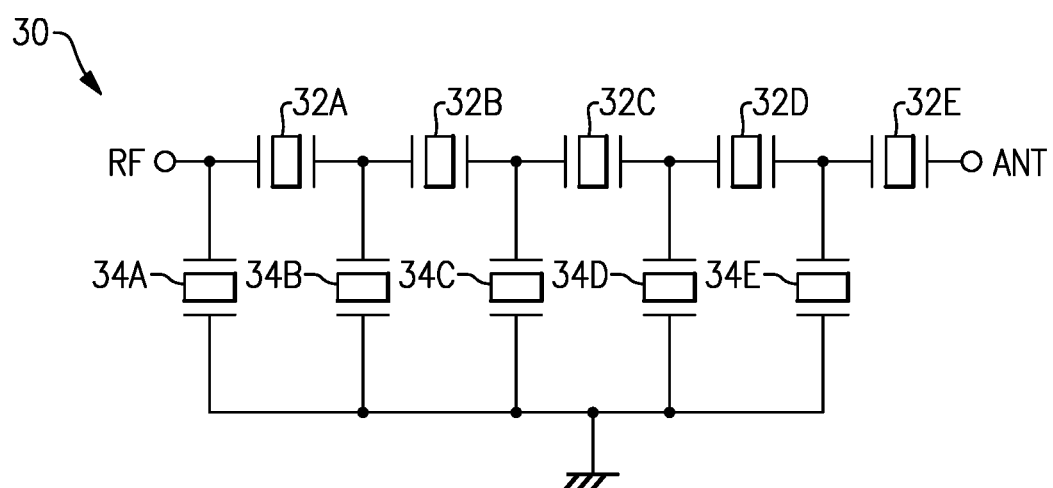
FIG. 4 is a schematic diagram of a ladder filter.

FIG. 4 is a schematic diagram of a ladder filter 30. The ladder filter 30 is an example topology of a filter formed from acoustic wave resonators. In some implementations, the filter 204 may be implemented using the ladder filter 30. The ladder filter 30 can be a band pass filter. In a band pass filter with a ladder filter topology, the shunt resonators can have lower resonant frequencies than the series resonators. The ladder filter 30 can be arranged to filter a radio frequency (RF) signal.

As illustrated, the ladder filter 30 includes series acoustic wave resonators 32A, 32B, 32C, 32D, and 32E and shunt acoustic wave resonators 34A, 34B, 34C, 34D, and 34E. The acoustic wave resonators of the ladder filter 30 are coupled between an RF port RF and an antenna port ANT. The acoustic wave resonators of the ladder filter 30 can include any suitable series acoustic wave resonators and/or shunt acoustic wave resonators. The RF port can be a transmit port for a transmit filter or a receive port for a receive filter. Each stage of the ladder filter 30 includes a series acoustic wave resonator and a shunt acoustic wave resonator. For example, a stage of the ladder filter 30 includes the shunt acoustic wave resonator 34A and the series acoustic wave resonator 32A.

Example Differential Acoustic Wave Device

Figure 5:
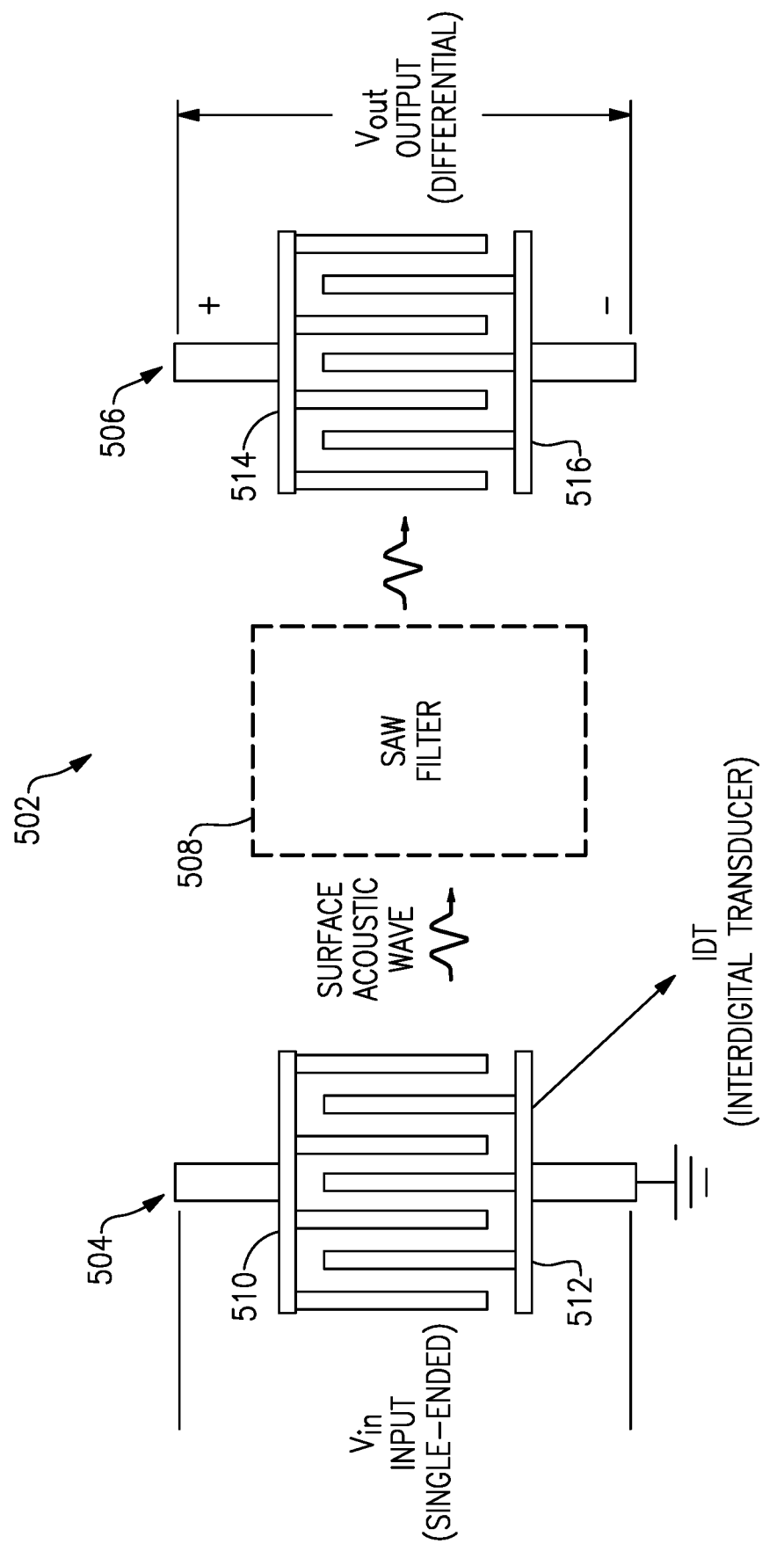
FIG. 5 is a schematic diagram of an acoustic wave filter with a pair of interdigital transducer (IDT) electrodes.

FIG. 5 is a schematic diagram of an acoustic wave filter 502 with a pair of interdigital transducer (IDT) electrodes 504, 506. The acoustic wave filter 502 may include a filter portion 508 that filters one or more frequencies of a signal received at the IDT electrode 504. The filtered signal may then be output by the IDT electrode 506. The acoustic wave filter 502 may be a surface acoustic wave filter with the filter portion 508 being a SAW filter. Further, the acoustic wave filter 502 may be or may include one or more of the aspects described with respect to the saw filter 204.

The IDT electrode 504 may be configured to convert a signal from an electrical medium to an acoustic medium. Similarly, the IDT electrode 506 may convert the filtered signal from an acoustic medium to an electric medium before outputting the signal.

As illustrated in FIG. 5, the input electrode (IDT electrode 504) may be single-ended. The single-ended input of the acoustic wave filter 502 may have one bus bar 510 connected to an input pin that receives an input signal. The second bus bar 512 of the IDT electrode 504 may be connected to ground.

Often, the output electrode of the acoustic wave filter is also single-ended. However, aspects of the present disclosure use a differential output converting the signal from single-ended to differential. As illustrated in FIG. 5, the output electrode (IDT electrode 506) may be differential. The differential output of the acoustic wave filter 502 may have one bus bar 514 (e.g., a positive terminal) providing a first output and a second bus bar 516 (e.g., a negative terminal) providing a second output. In some cases, the first output and the second output may be complementary signals with equal magnitude, but opposite phase. By receiving a single-ended signal at the IDT electrode 504 and outputting a differential signal at the IDT electrode 506, the received signal is converted to a differential signal. The differential signal may have a lower voltage compared to a non-differential signal. For example, each signal of the differential signal may have half the voltage. The magnitude of the signal voltages for the differential signal may depend on a number of factors. For example, the impedance transformation ratio of the connection between the output of a SAW filter 204, 604 (or acoustic wave filter 502) and the input of the LNA 206, 608 may affect the magnitude of the signal voltages. Additional factors that may affect the magnitude of the signal voltages for the differential signal may be related to the design of the acoustic wave filter 502 and/or the design of a subsequent SAW filter or balun that is in communication with the output of the acoustic wave filter 502 or LNA 206. In some cases, the voltage, or the amplitude of the voltage, of the single-ended signal may be the same as the voltage output by each of the positive and negative terminals. However, the phase of the signal may differ between the output at the positive and negative terminals. Advantageously, by converting the signal to a differential signal, the second harmonic intermodulation product may be reduced or eliminated due at least in part to destructive interference of the signals output at the positive and negative terminals of the acoustic wave filter 502.

The single-ended to differential acoustic wave filter 502 may be connected directly or indirectly to a differential low noise amplifier. By connecting the acoustic wave filter 502 to a differential LNA, a differential front-end module may be created without the use of a balun. Further, the balunless front-end module may reduce or eliminate the IM2 products improving the interference and noise rejection.

Example Differential Low Noise Amplifier

Figure 6:
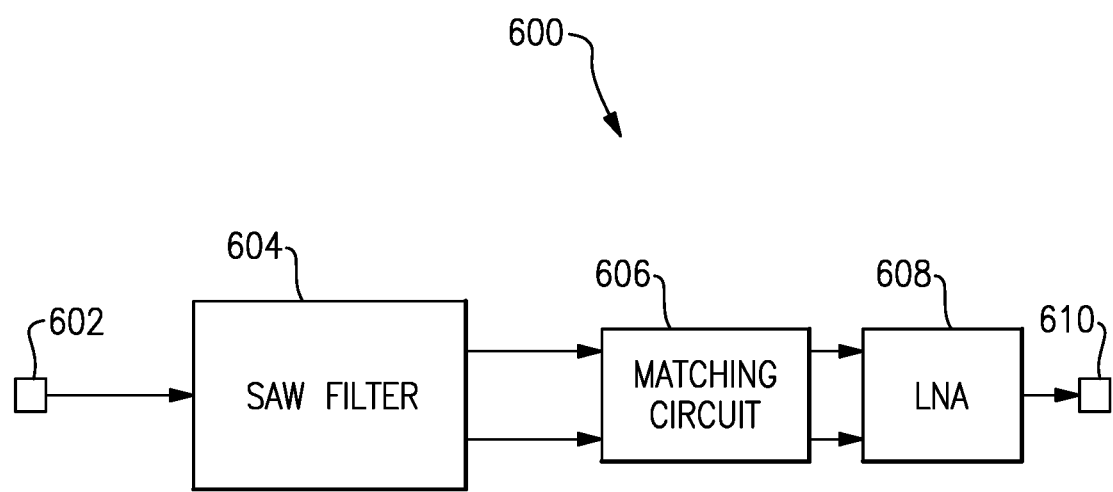
FIG. 6 is a block diagram of an example of a balunless differential low noise amplifier (LNA) circuit design that can be included in a front-end module.

FIG. 6 is a block diagram of an example of a balunless differential low noise amplifier (LNA) circuit 600 design that can be included in a front-end module, such as the front-end module 200, or in a receiver, such as a GPS receiver 108. The circuit 600 may include an input terminal 602. This input terminal 602 may receive a signal from an antenna or other circuitry that may be connected between the antenna and the front-end module 200. The signal received at the input terminal 602 may be a single signal or a non-differential signal. The signal may be provided to a SAW filter 604. The SAW filter 604 may be an acoustic wave device 502. Further, the SAW filter 604 may be replaced by other types of acoustic wave devices, such as by a BAW filter or a FBAW filter.

The SAW filter 604 may have a single-ended input configured to receive the signal from the input terminal 602. However, the SAW filter 604 may have a differential output configured to output two complementary signals using differential signaling techniques. Thus, the SAW filter 604 may convert a single signal to a differential signal as previously described with respect to the acoustic wave device 502.

The output of the SAW filter 604 may be connected to a matching circuit 606. The matching circuit 606 may be configured to match the impedance of the SAW filter 604 to the LNA 608. For example, the matching circuit 606 may be configured to match the SAW filter 604 to a 50-ohm input at the LNA 608. In some cases, the impedance of the differential lines may be cumulative. Thus, while a single-ended SAW filter output connected to single-ended LNA input may be impedance matched to 50 ohms, the impedance to be matched of the differential circuit may be up to 100 ohms. Accordingly, in some cases, the matching circuit 606 may be modified to match 100 ohms instead of 50 ohms.

The matching circuit 606 may be or may include one or more aspects of the LNA matching circuit 210. In some cases, the matching circuit 606 may be an inductor-based matching circuit formed from one or more inductors. In other cases, the matching circuit 606 may be an LC-based matching circuit formed from one or more inductors connected to one or more capacitors. In some cases, the matching circuit 606 may be a dynamic matching circuit that is configured based on one or more control signals. As described in more detail below with respect to FIG. 8, in some aspects, the matching circuit 606 may be optional or omitted.

The matching circuit 606 may maintain the differential signals output by the SAW filter 604 in differential form and may provide the differential signals to the LNA 608. In some cases, the matching circuit 606 is a single matching circuit. In other cases, the matching circuit 606 may be a pair of matching circuits with a single matching circuit configured to match one of the differential signal lines from the SAW filter 604 to the LNA 608. In other words, each transmission line between the SAW filter 604 and the LNA 608 may have its own matching circuit that together forms or is represented by the matching circuit 606. Each of the matching circuits 606 may be the same. Thus, for example, the matching circuit between the positive output of the SAW filter 604 and the LNA 608 may be identical to the matching circuit between the negative output of the SAW filter 604 and the LNA 608.

The output of the matching circuit 606 may be provided to a differential LNA 608. The differential LNA 608 may receive the differential signal, or the pair of complementary signals output by the matching circuit 606, and generate a single output based on the received differential signal pair. This output may be provided to the output terminal 610, which may provide the outputted signal to a receiver, such as a GPS receiver 108, or to other subsequent circuitry in the receive path of a wireless device 100.

Figure 7:
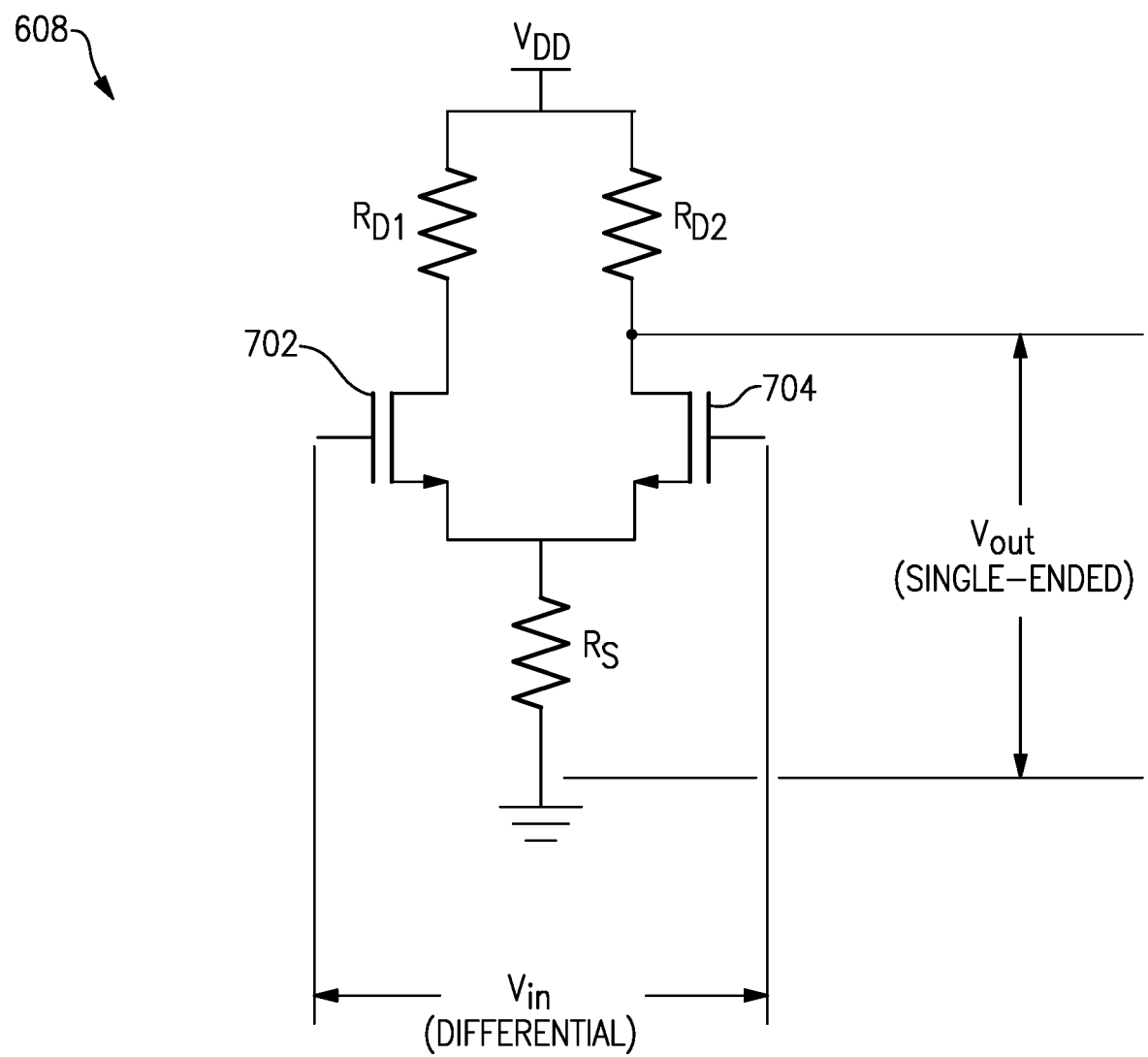
FIG. 7 is a circuit diagram of an aspect of a low noise amplifier with a differential input and a single-ended output.

FIG. 7 is a circuit diagram of an aspect of a low noise amplifier 608 with a differential input and a single-ended output. As illustrated, the LNA 608 may receive a differential input signal Vin. Each of the pair of complementary signals may be provided to a gate of a transistor. For example, a positive Vin signal may be provided to a gate of the transistor 702 and a negative Vin signal of the same magnitude but opposite phase as the positive Vin signal may be provided to a gate of the transistor 704.

The output of the LNA 608 may be a single-ended output Vout generated between the drain of the transistor 704 and ground. Further, the LNA 608 may include one or more resistor networks (e.g., $R_{D1}$ and $R_{D2}$) between the supply voltage Vdd and the drain of the transistors 702, 704, respectively. An additional resistor network (e.g., $R_S$) may exist between the source of the transistors 702, 704 and ground. Although a single transistor is illustrated for both the positive and negative signal paths of the LNA 608, it should be understood that the LNA 608 may be a multi-stage amplifier. Moreover, the LNA 608 is not limited to the use of nFETs for the transistors 702, 704. Instead, the transistors 702, 704 may be replaced with pFETs, BJTs, or other transistor types.

Figure 8:
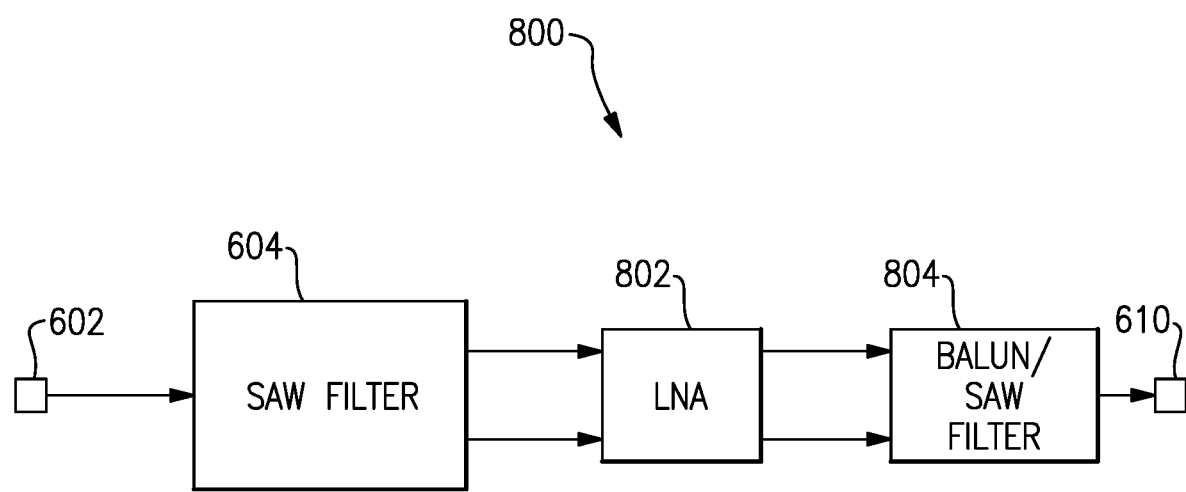
FIG. 8 is a block diagram of another example of a balunless differential low noise amplifier (LNA) circuit design that can be included in a front-end module.

FIG. 8 is a block diagram of another example of a balunless differential low noise amplifier (LNA) circuit 800 design that can be included in a front-end module, such as the front-end module 200, or in a receiver, such as a GPS receiver 108. Like the circuit 600, the circuit 800 can include a single-ended input terminal 602 and a single-ended output terminal 610. Further, the circuit 800 may include a SAW filter 604 or other type of acoustic wave filter.

In addition, the circuit 800 may include an LNA. However, unlike the LNA 608 of the circuit 600, the LNA 802 of the circuit 800 may be a differential LNA with both a differential input and a differential output. The circuit 800 may further include a balun and/or additional SAW filter 804 that may convert the differential output of the differential LNA 802 to a single-ended output, which may be provided to the output terminal 610. In other words, the entirety of the circuit 800 may be differential, and a balun (element 804) may be used prior to the output terminal 610 to convert the differential signal to a single signal. Alternatively, or in addition, a second acoustic wave filter (element 804), such as a SAW filter, may be used to convert the differential signal to a single signal. The second acoustic wave filter may be configured similarly to the acoustic wave filter 502, but in reverse. In other words, while the acoustic wave filter 502 may have a single-ended input with one bus bar connected to ground, and a differential output with neither bus bar connected to ground at the output, the second acoustic wave filter may have a differential input with neither bus bar connected to ground at the input and a single-ended output with one bus bar connected to ground.

As previously described, the SAW filter 604 may be an acoustic wave device 502. Besides the difference described in the previous paragraph with respect to the input and output terminals, the second acoustic wave filter (element 804) may also be an implementation of the acoustic wave device 502. Alternatively, the second acoustic wave filter may be a different type of acoustic wave filter. For example, the filter 604 may be a SAW filter while the filter 804 may be a BAW filter. In some implementations, the element 804 may be both a balun and acoustic wave filter. For example, the balun may convert the signal from a balanced (e.g., differential) input to an unbalanced (e.g., single-ended) output, while the second SAW filter may provide additional noise filtering. In some cases, additional filtering may be desired for the receiver. For example, a GPS receiver often requires more filtering or improved noise rejection compared to other receiver types. Advantageously, by using a second SAW filter for convert the differential signal to a non-differential signal, additional filtering may be providing in addition to the balun functionality. Thus, noise rejection may be improved in conjunction with the addition of the balun functionality without requiring the use of a balun.

In implementations that use a balun for element 804, the balun may be a transformer balun. However, the balun is not limited as such, and other types of baluns may be used. Further, as previously described, the balun may be replaced with a second SAW filter.

In some implementations, as previously described with respect to FIG. 6, a matching circuit may exist between the SAW filter 604 and the LNA 802. Further, in some cases, a second matching circuit may exist between the LNA 802 and the element 804. Alternatively, as illustrated in FIG. 8, the matching circuit(s) may be omitted. In some such implementations, the output of the SAW filter 604 and the input of the LNA 802 may be designed or configured with so that the elements are impedance matched. In some cases, the impedance matching may be achieved using transmission line matching. As, in some cases, the elements 604 and 802 are impedance matched, the need for an impedance matching circuit is eliminated. The impedance matching circuit between the LNA 802 and element 804 may be similarly eliminated. However, in some cases, on-die matching, or using transmission lines to match the impedance between the SAW filter 604 and the LNA 802 may be expensive in terms of the amount of area that is designated for the impedance matching. Further, the loss attributed to impedance matching may be higher in some cases than when Surface Mount Device (SMD) components (e.g., inductors and/or capacitors) are used. To minimize the area used for impedance matching, the impedance matching may be achieved using SMD components, such as for the matching circuit 606.

Advantageously, both the circuits 600 and 800 reduce intermodulation. Because the circuits 600 and 800 use differential signals, the intermodulation product of the positive and negative signal reduces or eliminates the second harmonic or the IM2 product. In other words, the positive and negative signals may cancel each other out at the second harmonic. This reduction in IM2 product reduces interference in a received signal, which may make it easier for the receiver to distinguish or identify a signal of a target frequency (e.g., the GPS signal or the Wi-Fi signal, etc.) from other received signals. It should be understood that the benefits of the present disclosure may also apply to other even harmonics (e.g., fourth, sixth, etc.).

In some implementations, the circuit 600 and/or the circuit 800 using a balun for the element 804 may be smaller than the version of the circuit 800 that uses a second acoustic wave filter for the element 804 or a combination balun and acoustic wave filter. Accordingly, for some size-constrained applications, the circuit 600 or the balun versions of the circuit 800 may be used. However, as described above, using a second acoustic wave filter to implement the balun prior to the output terminal 610 for the element 804 may provide improved noise rejection and/or signal filtering. Accordingly, for some applications that require improved or greater filtering, the circuit 800 with a second acoustic wave filter configured as a balun or in conjunction with a balun may be used.

Figure 9:
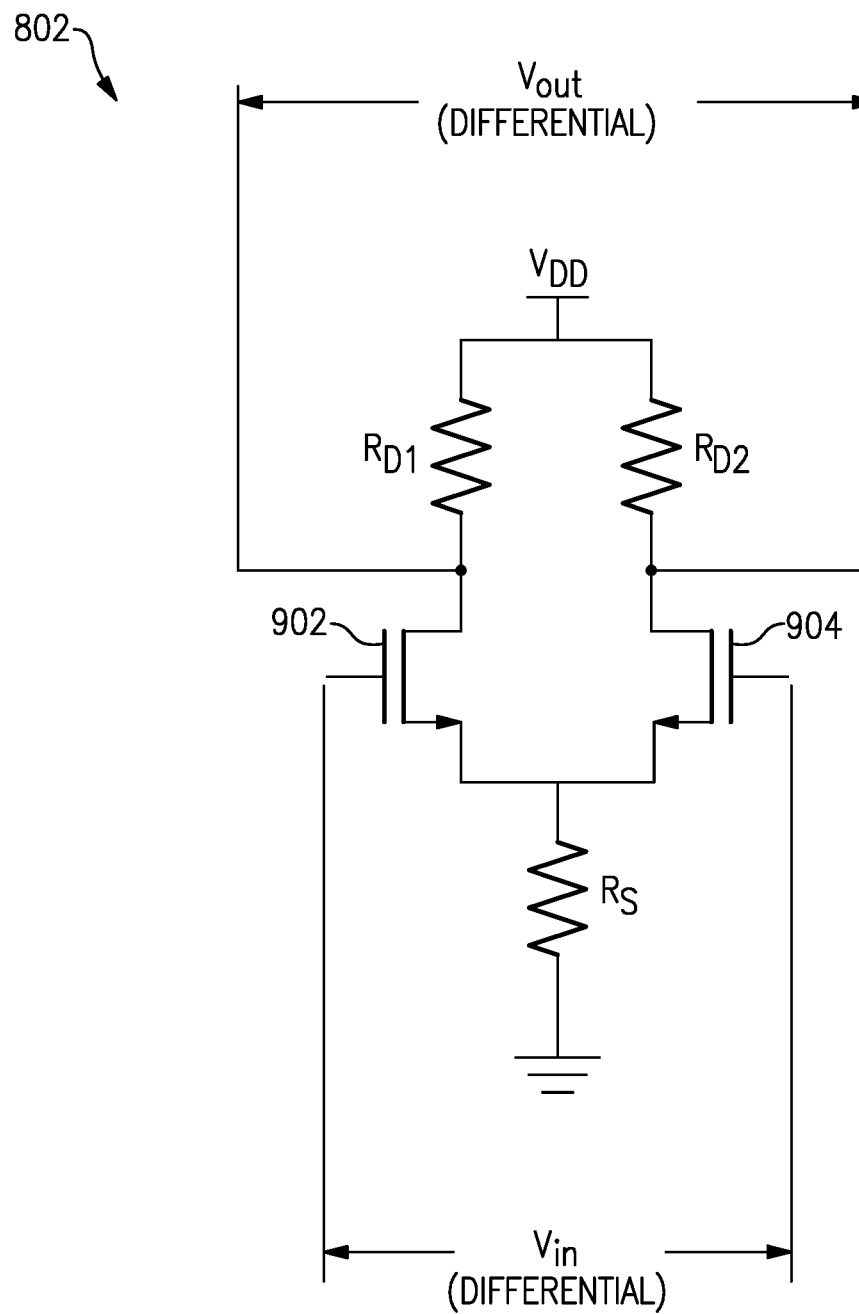
FIG. 9 is a circuit diagram of an aspect of a low noise amplifier with a differential input and a differential output.

FIG. 9 is a circuit diagram of an aspect of a low noise amplifier with a differential input and a differential output. As illustrated, the LNA 802 may receive a differential input signal Vin. Each of the pair of complementary signals may be provided to a gate of a transistor. For example, a positive Vin signal may be provided to a gate of the transistor 902 and a negative Vin signal of the same magnitude but opposite phase as the positive Vin signal may be provided to a gate of the transistor 904.

The output of the LNA 802 may be a differential output Vout. The output Vout may be from the drain of the transistor 902 and the drain of the transistor 904. For example, the signal at the drain of the transistor 902 may be positive signal and the signal at the drain of the transistor 904 may be a negative signal. The two signals may be complementary signals of equal magnitude, but opposite phase, and may form a differential signal pair. Further, the LNA 802 may include one or more resistor networks (e.g., $R_{D1}$ and $R_{D2}$) between the supply voltage Vdd and the transistors 902, 904, respectively. An additional resistor network (e.g., $R_S$) may exist between the source of the transistors 902, 904 and ground. Although a single transistor is illustrated for both the positive and negative signal paths of the LNA 802, it should be understood that the LNA 802 may be a multi-stage amplifier. Moreover, the LNA 802 is not limited to the use of nFETs for the transistors 902, 904. Instead, the transistors 902, 904 may be replaced with pFETs, BJTs, or other transistor types.

Additional SAW Filter Examples

Figure 10:
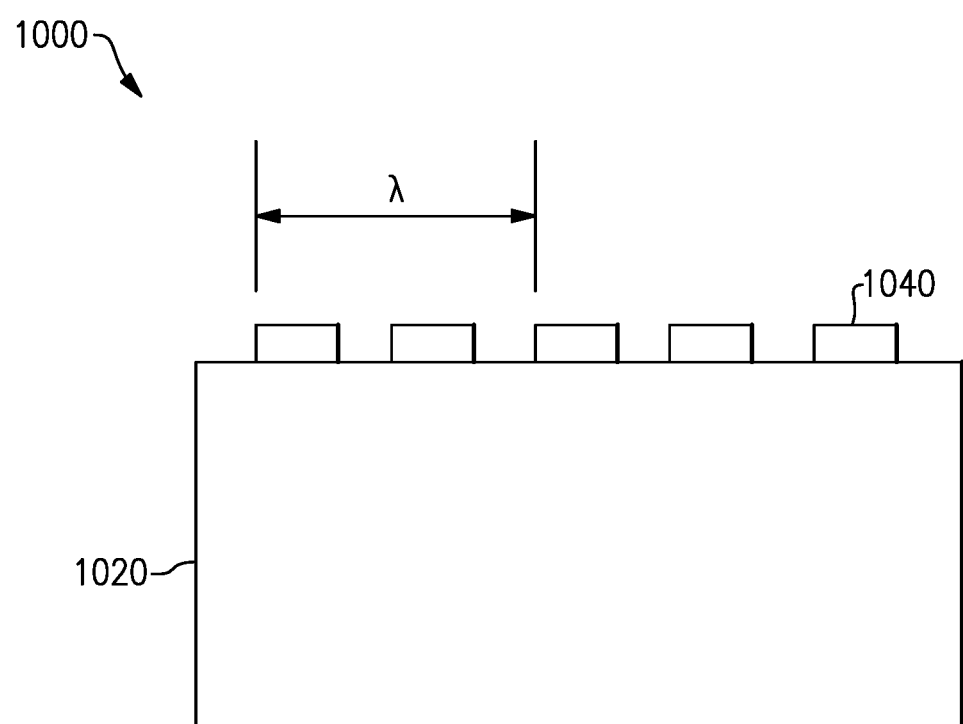
FIG. 10 is a diagram of a cross section of a SAW resonator according to an embodiment.

FIG. 10 is a diagram of a cross section of a SAW resonator 1000 according to an embodiment. The SAW resonator 1000 is an example of an acoustic wave resonator that can have a relatively narrow IDT electrode aperture. The SAW resonator 1000 is an example of a non-temperature compensated SAW resonator. SAW filters disclosed herein can include any suitable number of SAW resonators 1000. The illustrated SAW resonator 1000 includes a piezoelectric layer 1020 and an IDT electrode 1040 on the piezoelectric layer 1020. The piezoelectric layer 1020 can be a lithium niobate layer or a lithium tantalate layer, for example. The IDT electrode 1040 can have a relatively narrow aperture to concentrate a transverse spurious mode in frequency. The IDT electrode 1040 can be implemented in accordance with any suitable principles and advantages of the IDT electrode with a narrow aperture disclosed herein. The SAW resonator 1000 can be included as a series resonator in a filter to improve filter skirt steepness. The SAW resonator 1000 can be included as a shunt resonator in a filter to improve filter skirt steepness.

A relatively high density IDT electrode, such as tungsten (W) IDT electrode, can create technical challenges in a temperature-compensated SAW (TCSAW) resonator. Transverse mode suppression can be significant for TCSAW device performance. Including a relatively narrow IDT electrode aperture in accordance with the principles and advantages disclosed herein can achieve desirable performance in acoustic wave filters that include TCSAW resonator(s).

Figure 11:
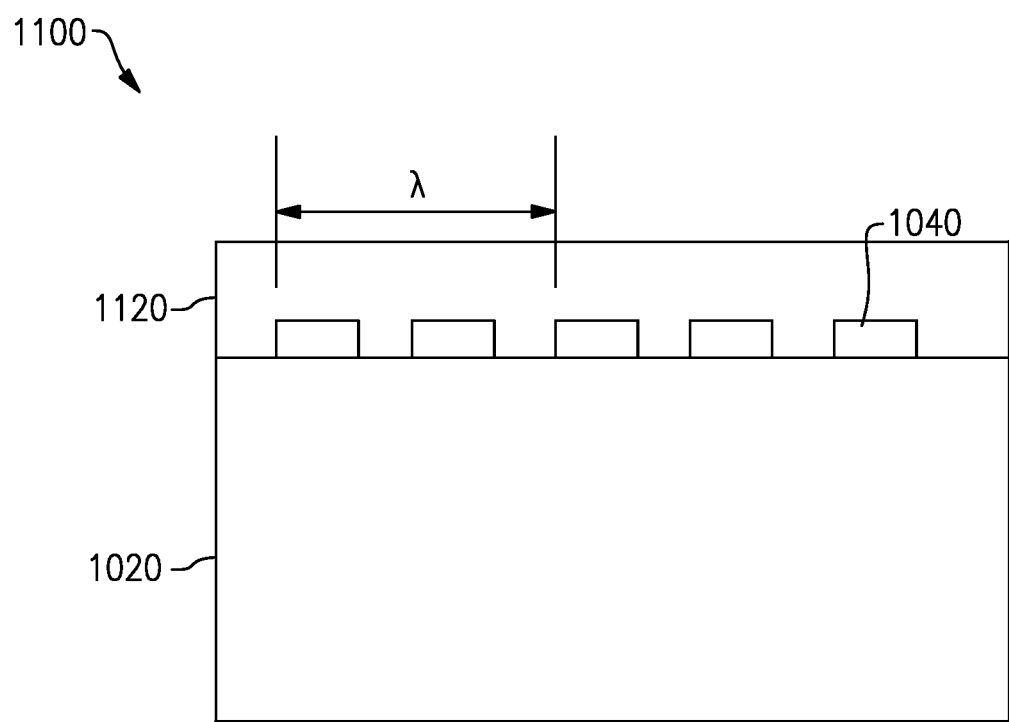
FIG. 11 is a diagram of a cross section of a temperature compensated SAW resonator according to an embodiment.

FIG. 11 is a diagram of a cross section of a temperature compensated SAW (TCSAW) resonator 1100 according to an embodiment. The TCSAW resonator 1100 is an example of an acoustic wave resonator that can have a relatively narrow IDT electrode aperture. SAW filters disclosed herein can include any suitable number of TCSAW resonators 1100. The illustrated TCSAW resonator 1100 includes a piezoelectric layer 1020, an IDT electrode 1040 on the piezoelectric layer 1020, and a temperature compensation layer 1120 over the IDT electrode 1040. The piezoelectric layer 1020 can be a lithium niobate substrate or a lithium tantalate substrate, for example. The IDT electrode 1040 can have a relatively narrow aperture to concentrate a transverse spurious mode in frequency. The IDT electrode 1040 can be implemented in accordance with any suitable principles and advantages of the IDT electrode with a narrow aperture disclosed herein. The SAW resonator 1100 can be included as a series resonator in a filter to improve filter skirt steepness. The SAW resonator 1100 can be included as a shunt resonator in a filter to improve filter skirt steepness.

The temperature compensation layer 1120 can bring the temperature coefficient of frequency (TCF) of the TCSAW resonator 1100 closer to zero relative to a similar SAW resonator without the temperature compensation layer 1120. The temperature compensation layer 1120 can have a positive TCF. This can compensate for the piezoelectric layer 1020 having a negative TCF. The temperature compensation layer 1120 can be a silicon dioxide ($SiO_2$) layer. The temperature compensation layer 1120 can include any other suitable temperature compensating material including without limitation a tellurium dioxide ($TeO_2$) layer or a silicon oxyfluoride (SiOF layer). The temperature compensation layer 1120 can include any suitable combination of $SiO_2$, $TeO_2$, and/or SiOF.

Figure 12:
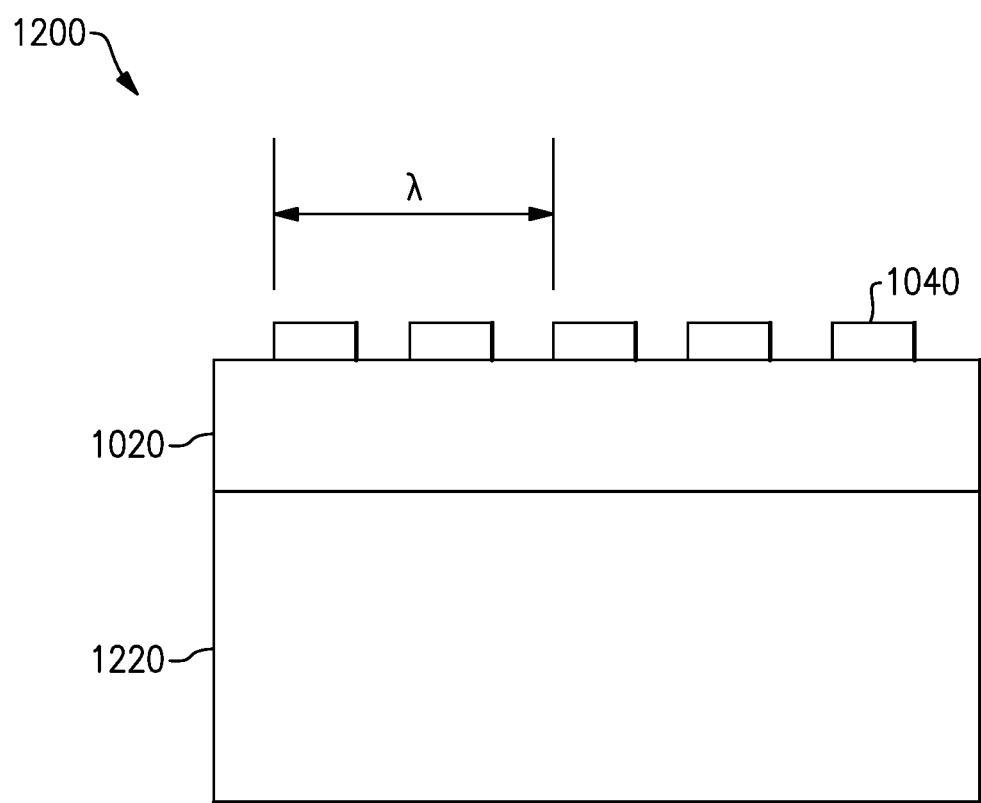
FIG. 12 is a diagram of a cross section of a multilayer piezoelectric substrate SAW resonator according to an embodiment.

FIG. 12 is a diagram of a cross section of a multilayer piezoelectric substrate (MPS) SAW resonator 1200 according to an embodiment. The MPS SAW resonator 1200 is an example of an acoustic wave resonator that can have a relatively narrow IDT aperture. SAW filters disclosed herein can include any suitable number of MPS SAW resonators 1200. The illustrated MPS SAW resonator 1200 includes a multilayer piezoelectric substrate including a piezoelectric layer 1020 and a support substrate 1220. The MPS SAW resonator 1200 also includes an IDT electrode 1040 on the piezoelectric layer 1020.

The piezoelectric layer 1020 can be a lithium niobate substrate or a lithium tantalate substrate, for example. In certain instances, the piezoelectric layer 1020 can have a thickness of less than λ, in which λ is a wavelength of a surface acoustic wave generated by the MPS SAW resonator 1200. In some other instances, the piezoelectric layer 1020 can have a thickness on the order of 10s of λ, in which λ is a wavelength of a surface acoustic wave generated by the MPS SAW resonator 1200. The thickness of the piezoelectric layer 1020 can be in a range from about 20 microns to 30 microns in certain applications. The support substrate 1220 can be a silicon substrate, a quartz substrate, a sapphire substrate, a polycrystalline spinel substrate, or any other suitable carrier substrate. As one example, the MPS SAW resonator 1200 can include a piezoelectric substrate 1020 that is lithium tantalate and a support substrate 114 that is silicon.

In some instances (not illustrated), one or more additional layers can be included in the multilayer piezoelectric substrate of an MPS SAW resonator. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a lithium tantalate layer over a silicon dioxide layer over an aluminum nitride layer over a silicon layer. As one more illustrative example, a multilayer piezoelectric substrate can include a lithium niobate layer over a silicon dioxide layer over a high impedance layer, in which the high impedance layer has a higher acoustic impedance than the lithium niobate layer.

In the MPS SAW resonator 1200, the IDT electrode 1040 can have a relatively narrow aperture to concentrate a transverse spurious mode in frequency. The IDT electrode 1040 can be implemented in accordance with any suitable principles and advantages of the IDT electrode with a narrow aperture disclosed herein. The MPS SAW resonator 1200 can be included as a series resonator in a filter to improve filter skirt steepness. The MPS SAW resonator 1200 can be included as a shunt resonator in a filter to improve filter skirt steepness.

Terminology

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A front-end module comprising:
an acoustic wave filter including a first interdigital transducer electrode and a second interdigital transducer electrode, the first interdigital transducer electrode being single-ended with a first input bus bar configured to receive an input signal and a second input bus bar connected to ground, and the second interdigital transducer electrode being differential with a first output bus bar connected to a first output terminal and a second output bus bar connected to a second output terminal;
a low noise amplifier with a differential input electrically connected to the acoustic wave filter, the low noise amplifier including a first input transistor configured to receive a first signal from the first output terminal of the acoustic wave filter and a second input transistor configured to receive a second signal from the second output terminal of the acoustic wave filter, the low noise amplifier configured to output a differential signal via a differential output; and
a balun electrically connected to the differential output of the low noise amplifier, the balun being a transformer balun that is configured to convert a differential output to a single-ended output.

2. The front-end module of claim 1 wherein the differential output includes a first output node and a second output node.

3. The front-end module of claim 2 wherein the first output node is connected to a drain of the first input transistor and the second output node is connected to a drain of the second input transistor.

4. The front-end module of claim 1 wherein the first output terminal is a positive terminal and the second output terminal is a negative terminal.

5. The front-end module of claim 1 wherein the acoustic wave filter is one of a surface acoustic wave filter, a bulk acoustic wave filter, a temperature compensated surface acoustic wave filter, or a film bulk acoustic wave filter.

6. The front-end module of claim 1 further comprising a first matching circuit connected between the first output terminal of the acoustic wave filter and the first input transistor of the low noise amplifier.

7. The front-end module of claim 6 further comprising a second matching circuit connected between the second output terminal of the acoustic wave filter and the second input transistor of the low noise amplifier.

8. The front-end module of claim 6 wherein the first matching circuit is configured to perform impedance matching between the acoustic wave filter and the low noise amplifier.

9. The front-end module of claim 1 further comprising a second acoustic wave filter.

10. The front-end module of claim 9 wherein the differential output of the low noise amplifier includes a first output node and a second output node, and the second acoustic wave filter includes a first interdigital transducer electrode and a second interdigital transducer electrode, the first interdigital transducer electrode of the second acoustic wave filter being differential, and having a first input bus bar configured to receive a first input signal from the first output node and a second input bus bar configured to receive a second input signal from a second output node, and the second interdigital transducer electrode being single-ended with a first output bus bar connected to an output terminal and a second output bus bar connected to ground.

11. The front-end module of claim 9 wherein the second acoustic wave filter is of a different type or is configured differently than the acoustic wave filter.

12. The front-end module of claim 1 wherein a connection between the acoustic wave filter and the low noise amplifier is configured to provide balun functionality between the acoustic wave filter and the low noise amplifier without inclusion of a balun circuit element before the differential input of the low noise amplifier.

13. A multi-chip module comprising:
a stacked filter low noise amplifier circuit including an acoustic wave filter and a low noise amplifier with a differential input electrically connected to the acoustic wave filter, the acoustic wave filter including a first interdigital transducer electrode and a second interdigital transducer electrode, the first interdigital transducer electrode being single-ended with a first input bus bar configured to receive an input signal and a second input bus bar connected to ground, and the second interdigital transducer electrode being differential with a first output bus bar connected to a first output terminal and a second output bus bar connected to a second output terminal, and the low noise amplifier including a first input transistor configured to receive a first signal from the first output terminal of the acoustic wave filter and a second input transistor configured to receive a second signal from the second output terminal of the acoustic wave filter, the low noise amplifier configured to output a differential signal via a differential output; and a signal converter configured to convert the differential signal from the differential output to a single signal, the signal converter including a balun electrically connected to the differential output of the low noise amplifier, and the balun being a transformer balun that is configured to convert a differential output to a single-ended output.

14. The multi-chip module of claim 13 wherein the signal converter includes a second acoustic wave filter that includes a first interdigital transducer electrode and a second interdigital transducer electrode, the first interdigital transducer electrode of the second acoustic wave filter being differential, and having a first input bus bar configured to receive a first input signal from a first output node of the low noise amplifier and a second input bus bar configured to receive a second input signal from a second output node of the low noise amplifier, and the second interdigital transducer electrode being single-ended with a first output bus bar connected to an output terminal and a second output bus bar connected to ground.

15. The multi-chip module of claim 13 further comprising a first matching circuit connected between the first output terminal of the acoustic wave filter and the first input transistor of the low noise amplifier, and a second matching circuit connected between the second output terminal of the acoustic wave filter and the second input transistor of the low noise amplifier.

16. The multi-chip module of claim 13 wherein the differential output includes a first output node and a second output node, and the first output node is connected to a drain of the first input transistor and the second output node is connected to a drain of the second input transistor.

17. The multi-chip module of claim 13 wherein a connection between the acoustic wave filter and the low noise amplifier is configured to provide balun functionality between the acoustic wave filter and the low noise amplifier without inclusion of a balun circuit element before the differential input of the low noise amplifier.

18. A wireless device comprising:
an antenna configured to receive a plurality of signals, each signal of the plurality of signals associated with a different frequency band; and
a front-end module including an acoustic wave filter, a low noise amplifier with a differential input electrically connected to the acoustic wave filter, and a balun, the acoustic wave filter including a first interdigital transducer electrode and a second interdigital transducer electrode, the first interdigital transducer electrode being single-ended with a first input bus bar configured to receive an input signal and a second input bus bar connected to ground, and the second interdigital transducer electrode being differential with a first output bus bar connected to a first output terminal and a second output bus bar connected to a second output terminal, and the low noise amplifier including a first input transistor configured to receive a first signal from the first output terminal of the acoustic wave filter and a second input transistor configured to receive a second signal from the second output terminal of the acoustic wave filter, the low noise amplifier configured to output a differential signal via a differential output, the balun electrically connected to the differential output of the low noise amplifier, and the balun being a transformer balun that is configured to convert a differential output to a single-ended output.

19. The wireless device of claim 18 wherein the acoustic wave filter and the low noise amplifier are implemented in a stacked filter low noise amplifier circuit.

20. The wireless device of claim 18 wherein the front-end module includes a second acoustic wave filter that includes a first interdigital transducer electrode and a second interdigital transducer electrode, the first interdigital transducer electrode of the second acoustic wave filter being differential, and having a first input bus bar configured to receive a first input signal from a first output node of the low noise amplifier and a second input bus bar configured to receive a second input signal from a second output node of the low noise amplifier, and the second interdigital transducer electrode being single-ended with a first output bus bar connected to an output terminal and a second output bus bar connected to ground.

* * * * *